US008881672B2

(12) United States Patent
Fischer et al.

(10) Patent No.: US 8,881,672 B2
(45) Date of Patent: Nov. 11, 2014

(54) UNIVERSAL ATOMIZER

(75) Inventors: Andreas Fischer, Ludwigsburg (DE); Peter Marquardt, Steinheim (DE); Hans-Jürgen Nolte, Besigheim (DE); Jürgen Berkowitsch, Neuhausen (DE)

(73) Assignee: Duerr Systems, GmbH, Bietigheim-Bissingen (DE)

( * ) Notice: Subject to any disclaimer, the term of this patent is extended or adjusted under 35 U.S.C. 154(b) by 677 days.

(21) Appl. No.: 12/997,426

(22) PCT Filed: Jun. 12, 2009

(86) PCT No.: PCT/EP2009/004254
§ 371 (c)(1), (2), (4) Date: Dec. 10, 2010

(87) PCT Pub. No.: WO2009/149950
PCT Pub. Date: Dec. 17, 2009

(65) Prior Publication Data

US 2011/0086166 A1 Apr. 14, 2011

(30) Foreign Application Priority Data

Jun. 12, 2008 (DE) ......................... 10 2008 027 997

(51) Int. Cl.

| | |
|---|---|
| ***B05B 9/03*** | (2006.01) |
| ***C23C 16/06*** | (2006.01) |
| ***B05C 5/00*** | (2006.01) |
| ***B05B 5/04*** | (2006.01) |

(52) U.S. Cl.
CPC ............. *B05B 5/0426* (2013.01); *B05B 5/0407* (2013.01); *B05B 5/0403* (2013.01); *C23C 16/06* (2013.01); *B05C 5/00* (2013.01)
USPC ............ 118/313; 118/715; 118/300; 239/214

(58) Field of Classification Search
None
See application file for complete search history.

(56) References Cited

U.S. PATENT DOCUMENTS

| | | | |
|---|---|---|---|
| 4,760,965 | A | 8/1988 | Schneider |
| 5,980,994 | A | 11/1999 | Honma et al. |

(Continued)

FOREIGN PATENT DOCUMENTS

| | | | |
|---|---|---|---|
| DE | 10202712 | A1 | 7/2003 |
| DE | 102005015604 | A1 | 10/2006 |

(Continued)

OTHER PUBLICATIONS

Station 1, EcoBell2, Durr Open House 2007; Jul. 24, 2007; pp. 4 & 6.*

(Continued)

*Primary Examiner* — Dah-Wei D Yuan
*Assistant Examiner* — Jethro M Pence
(74) *Attorney, Agent, or Firm* — Bejin Bieneman PLC

(57) ABSTRACT

The exemplary illustrations relate to an atomization system for a rotary atomizer for applying a coating agent, comprising a rotatably supported bell plate for atomizing the coating agent and for dispensing a spray jet of the coating agent, and comprising a guiding air ring for dispensing a first guiding air flow and a second guiding air flow for producing the spray jet dispensed by the bell plate. The two guiding air flows may comprise separate guiding air flow feeds and may further be set independently from each other. An exemplary bell plate and the guiding air ring may be designed such that the atomization system is suitable for coating the inside of chassis parts of motor vehicles and for coating the outside of chassis parts of motor vehicles.

14 Claims, 10 Drawing Sheets

(56) References Cited

U.S. PATENT DOCUMENTS

| | | | | |
|---|---|---|---|---|
| 8,481,124 | B2 * | 7/2013 | Nolte et al. | 427/421.1 |
| 2002/0090461 | A1 | 7/2002 | Ohmoto et al. | |
| 2009/0220703 | A1 | 9/2009 | Wohr et al. | |
| 2011/0000974 | A1 | 1/2011 | Nolte et al. | |

FOREIGN PATENT DOCUMENTS

| | | | | |
|---|---|---|---|---|
| DE | 102006054786 | A1 | 5/2008 | |
| DE | 102006057596 | A1 | 6/2008 | |
| EP | 0245849 | A2 | 11/1987 | |
| EP | 1250960 | A2 | 10/2002 | |
| JP | H06218301 | | 8/1994 | |
| JP | H07265746 | | 10/1995 | |
| JP | 08099052 | A * | 4/1996 | B05B 3/10 |
| JP | 2000070769 | | 3/2000 | |
| JP | 2003225592 | | 8/2003 | |
| JP | 2005144319 | | 6/2005 | |
| WO | WO-2008061584 | A1 | 5/2008 | |
| WO | WO-2008/068005 | A1 | 6/2008 | |

OTHER PUBLICATIONS

International Search Report PCT/EP2009/004254 dated Oct. 8, 2009.

Station 1, EcoBell2, Durr Open House 2007; Jul. 24, 2007; 7 pages.

High Speed Rotating Atomizer EcoBell2 for Internal Charging, www.durr.com, Durr Product Info, Feb. 10, 2008; 2 pages.

* cited by examiner

UNIVERSAL ATOMIZER

CROSS-REFERENCE TO RELATED APPLICATIONS

This application is a National Stage application which claims the benefit of International Application No. PCT/EP2009/004254 filed Jun. 12, 2009, which claims priority based on German Application No. 10 2008 027 997.8, filed Jun. 12, 2008, both of which are hereby incorporated by reference in their entirety.

BACKGROUND

The present disclosure relates to an atomisation system for a rotary atomiser and a corresponding method of operation.

In modern painting installations for the painting of motor vehicle bodies, for the most part—with the exception of the so-called box concept—a plurality of paint booths, in which painting robots execute various painting operations, are arranged one behind the other along a painting line. So, for example, in a first paint booth, the interior of the individual motor vehicle bodies can be coated with a primer. In the next paint booth, the outer surfaces of the motor vehicle body can then be coated with the primer. Next, a dryer then follows, in which the primer layer applied onto the motor vehicle body dries, before a base coat is then applied onto the inner surfaces of the motor vehicle body in a further paint booth. The outer surfaces of the motor vehicle bodies are then coated with two base coat layers in two consecutive paint booths one after the other ("wet-on-wet"). Alternatively, there is also the possibility however, that initially the outer surfaces and then the inner surfaces are coated with the base coat. After the application of the base coat layers, a clear coat is then initially applied onto the inner surfaces and then onto the outer surfaces of the motor vehicle body in two consecutive paint booths. Finally, the motor vehicle body painted in this manner is then dried in a dryer. Furthermore, there is a so-called 3-wet process, in which the previously mentioned drying steps can be omitted.

The coating of the motor vehicle body with the various coating agents (primer, base coat, clear coat) in the consecutive paint booths conventionally takes place by means of multi-axial painting robots or painting machines (e.g. roof machines, side machines) which, as application devices have a rotary atomiser, the rotary atomisers being adapted in the various paint booths to the coating material used and the incidental painting operation. So, for example, for interior painting rotary atomisers with a different bell cup are used than in the case of exterior painting. This has the consequence that, for the complete painting of a motor vehicle body, a plurality of paint booths with different rotary atomisers and the associated application technology are required, which is associated with a high outlay in terms of installation engineering.

A further disadvantage of the individual adaptation of the rotary atomiser to the respective painting operations (interior painting, exterior painting or metallic painting) lies in the high operating costs and the expensive storage.

The same problem also applies in the case of coatings in industry in general and in the automotive supply industry, where attachment parts (e.g. bumpers, fuel tank caps, mirror housings, etc.) are painted.

Accordingly, there is a need to reduce the outlay in terms of installation engineering in the case of the painting of motor vehicle bodies.

BRIEF DESCRIPTION OF THE FIGURES

While the claims are not limited to the specific illustrations described herein, an appreciation of various aspects is best gained through a discussion of various examples thereof. Referring now to the drawings, illustrative examples are shown in detail. Although the drawings represent the exemplary illustrations, the drawings are not necessarily to scale and certain features may be exaggerated to better illustrate and explain an innovative aspect of an illustration. Further, the exemplary illustrations described herein are not intended to be exhaustive or otherwise limiting or restricting to the precise form and configuration shown in the drawings and disclosed in the following detailed description. Exemplary illustrations are described in detail by referring to the drawings as follows:

DETAILED DESCRIPTION

Figure 1:
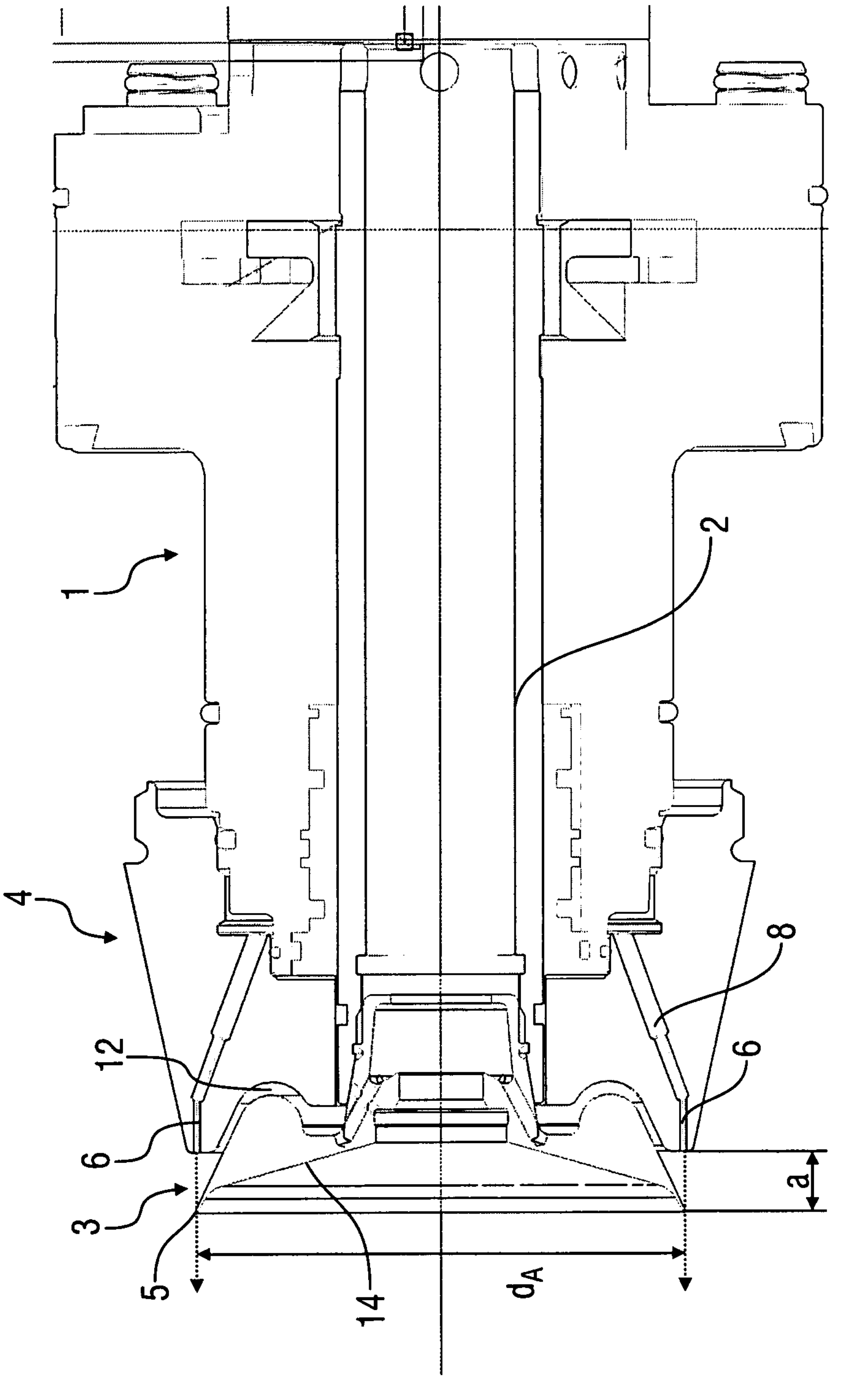
FIG. 1 shows a cross-sectional view of an exemplary atomisation system with a bell cup, a shaping air ring and a turbine, which are used in a rotary atomiser.
Figure 2:
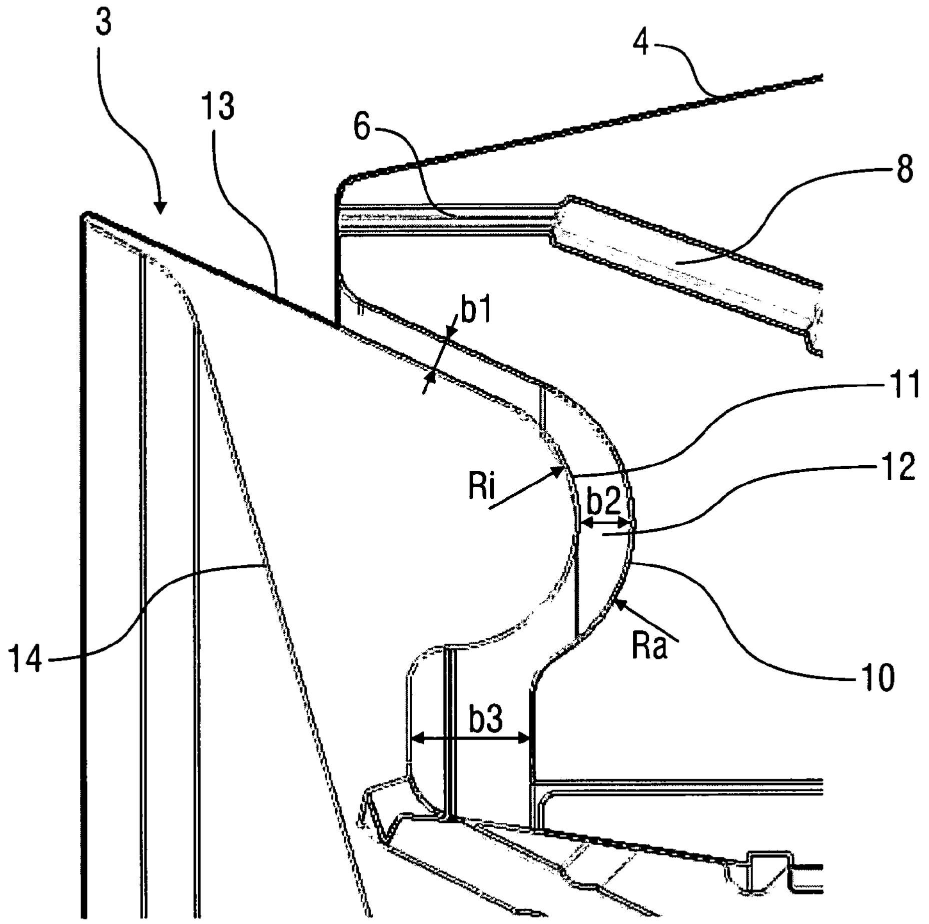
FIG. 2 shows a detail view from FIG. 1 in the region of the gap between the bell cup and the shaping air ring.
Figure 3:
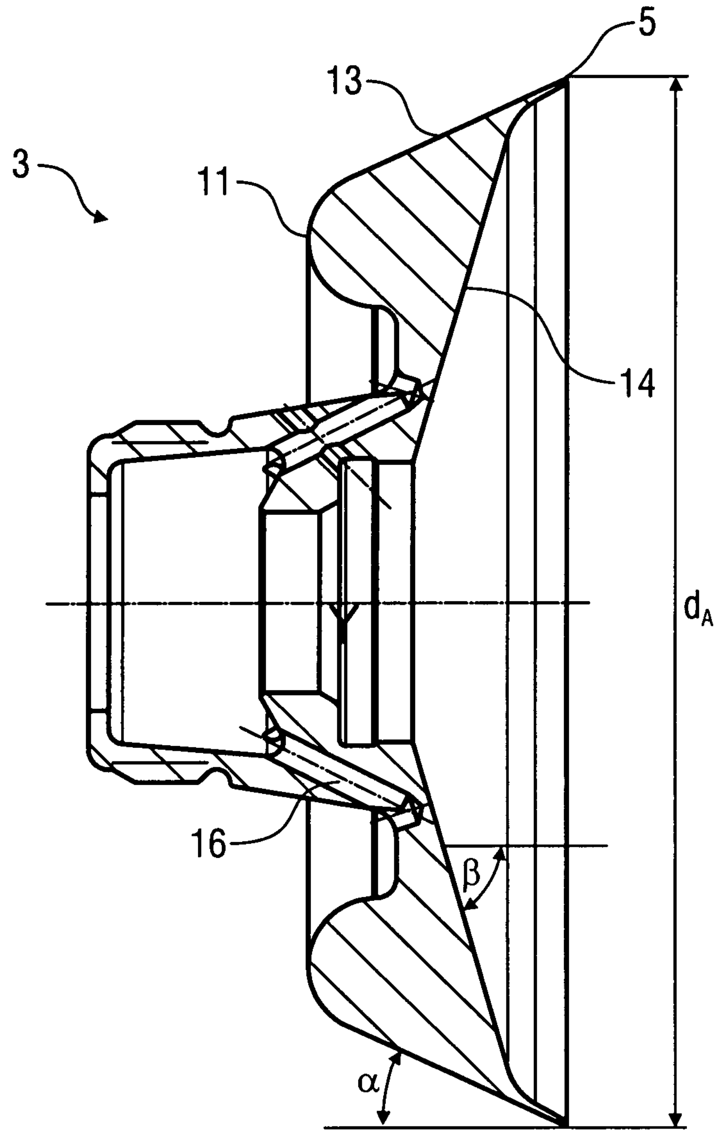
FIG. 3 shows a cross-sectional view of the bell cup from FIG. 1.
Figure 4:
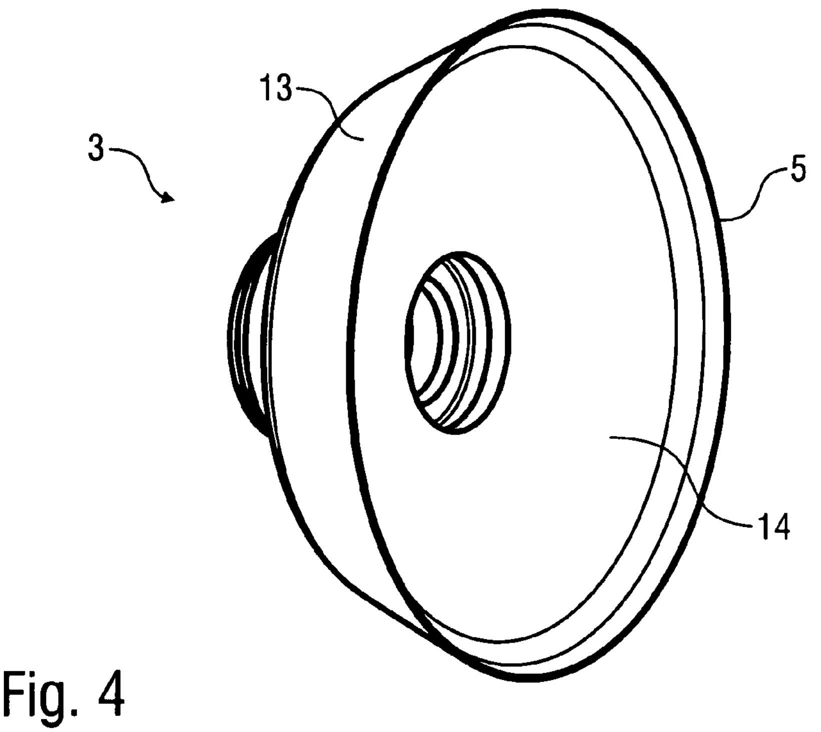
FIG. 4 shows a front perspective view of the bell cup from FIG. 1.
Figure 5:
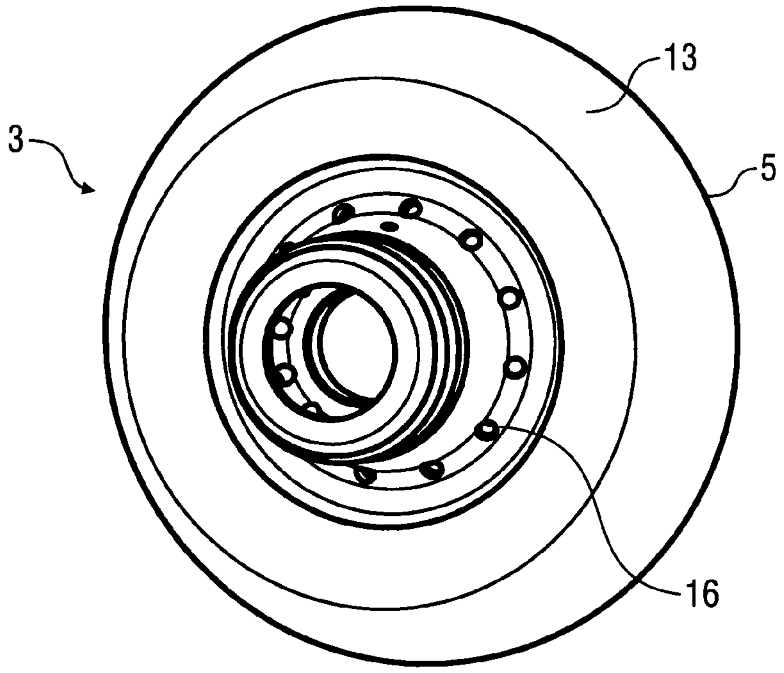
FIG. 5 shows a rear perspective view of the bell cup from FIG. 1.
Figure 6:
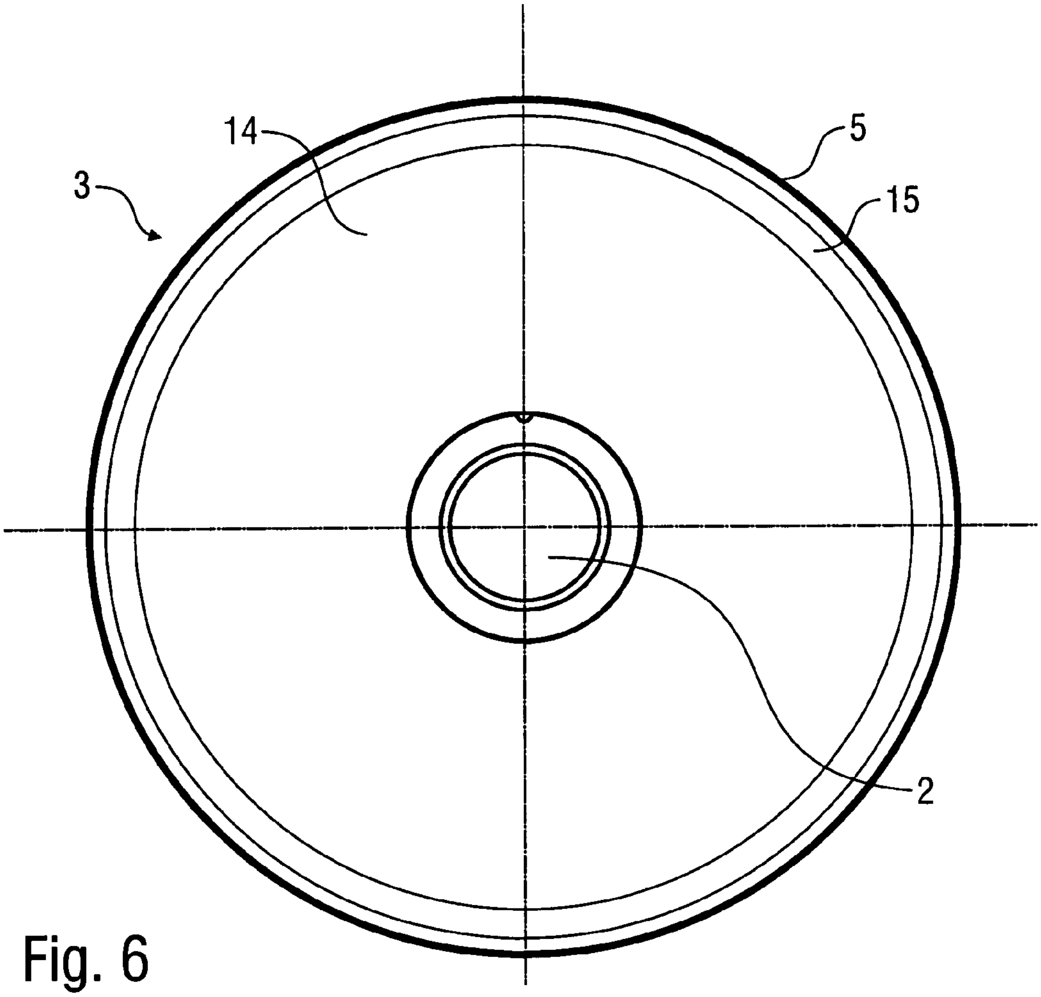
FIG. 6 shows a front view of the bell cup from FIG. 1.

The exemplary illustrations comprise the general technical teaching of carrying out the various painting operations (e.g. interior painting and exterior painting) with a single atomisation system in a single paint booth or painting zone when painting motor vehicle bodies, as a result of which the outlay in terms of installation engineering is strongly reduced, as the additional paint booths required in the prior art can be dispensed with.

A further advantage of the exemplary illustrations is the greater flexibility, as a single atomisation system can carry out various painting operations (e.g. interior painting and exterior painting).

The exemplary illustrations therefore provide an atomisation system for a rotary atomiser, which is suitable both for interior painting and for exterior painting of motor vehicle body components.

Furthermore, the exemplary atomisation system may also be suitable for the application of a metallic paint or another effect paint.

Furthermore, the exemplary atomisation system, which can be used universally, may also be suitable for the application of various coating agents, such as for example filler, base coat and clear coat.

Further, the exemplary atomisation system may also be suitable for the application of various paint systems, such as for example solvent paints or water-based paints.

Furthermore, the exemplary atomisation system may be suitable both for electrostatic painting and for painting without high voltage.

The exemplary illustrations of a universally usable atomisation system may generally function in the previously mentioned painting operations at least just as well or even better than the specifically adapted atomisation systems which have hitherto been used.

A further advantage of the exemplary universally usable atomisation systems is that the risk of mix up which exists in the prior art is minimized or even excluded.

Here, an exemplary atomisation system may enable an application efficiency according to German Industrial Standard DIN EN 13966-1 (Determination of the Transfer Efficiency of Atomising and Spraying Equipment for Liquid Coating Materials Part 1: Flat Panels) of more than 55%, 60%, 65%, 70%, 75%, 80% or even more than 85% in the case of exterior painting and/or in the case of the application of metallic paint or effect paint.

Furthermore, in the case of interior painting, exterior painting and/or in the case of the application of a metallic paint or another effect paint for achieving the conventional requirements on colour match, the exemplary atomisation system may enable a total colour difference ΔE* according to the CIELAB colour model predefined by CIE (Commission Internationale de l'Éclairage) in accordance with DIN 6174 of less than ±3, ±2, ±1.5 or even less than ±1, an angle of observation in the range of 25°-75° being assumed. Here, it is to be mentioned that the total colour difference has fluctuations, so that the average value may be taken as a basis.

To this end, the exemplary atomisation system has a rotatably mounted bell cup for the atomisation of the respective coating agent and for discharging a spray jet of the coating agent. The bell cup is here adapted in terms of its design so that the bell cup is suitable both for interior painting and for exterior painting or for painting of metallic or effect paints, as is described in detail below.

Furthermore, the exemplary atomisation system may have a shaping air ring for discharging first shaping air and second shaping air for shaping the spray jet discharged by the bell cup, the two shaping airs having separate shaping air inlets and being settable independently of one another. The shaping air ring is likewise adapted in terms of its design so that the atomisation system is suitable both for interior painting and for exterior painting or for painting of metallic or effect paints, as is described in detail below. The shaping air ring may be adapted in such a manner that the atomisation system is also suitable for the application of clear coat and filler.

In one exemplary illustration, the bell cup has an annular circumferential spray edge with a predetermined external diameter. Here, for discharging the first shaping air, the shaping air ring has a first shaping air nozzle annulus with a plurality of shaping air nozzles arranged in an annularly distributed manner, the first shaping air nozzle annulus having a certain diameter which is essentially equal to the external diameter of the spray edge of the bell cup, so that the first shaping air is directed onto the spray edge of the bell cup. This is advantageous, because the first shaping air can in this manner likewise contribute to the atomisation of the spray jet discharged by the bell cup.

Furthermore, for discharging the second shaping air, the shaping air ring may have a second shaping air nozzle annulus with a plurality of shaping air nozzles arranged in an annularly distributed manner, the second shaping air nozzle annulus having a certain diameter which is essentially equal to the external diameter of the spray edge of the bell cup, so that the second shaping air is also directed essentially onto the spray edge of the bell cup and as a result can contribute to the atomisation of the applied coating agent.

It is not necessary here, however, that the diameter of the two shaping air nozzle annuluses is exactly equal to the external diameter of the spray edge of the bell cup. Rather, between the external diameter of the spray edge of the bell cup on the one hand and the diameter of the two shaping air nozzle annuluses on the other hand, a radial deviation of up to ±1 mm, ±2 mm or even ±3 mm is possible.

In another exemplary illustration, the shaping air nozzles of the first shaping air nozzle annulus are orientated axially onto the axis of rotation of the bell cup and therefore axially discharge the first shaping air. The shaping air nozzles of the second shaping air nozzle annulus are by contrast orientated in the circumferential direction against the direction of rotation of the bell cup in one example, so that the second shaping air is discharged with a predetermined angle of twist in the circumferential direction. The second shaping air is therefore angled against the direction of rotation of the bell cup, as a result of which the atomisation action of the second shaping air is additionally improved.

An angle of twist of the second shaping air may be essentially 55° in the circumferential direction. The exemplary illustrations are not limited to the exact value of 55° with respect to the angle of twist of the second shaping air, but rather can also be realised with other angles of twist. For example, the angle of twist can be in the range of 40° to 70°, a range of 50° to 60° being advantageous.

The shaping airs may advantageously impinge as exactly as possible onto the spray edge of the bell cup, in order to contribute to the atomisation of the applied coating agent. The twisted second shaping air covers a longer distance than the axially orientated first shaping air between the shaping air nozzles and the spray edge of the bell cup, however. The shaping air nozzles twisted in the circumferential direction therefore may have a radial inward offset compared to the axially orientated shaping air nozzles, the radial offset being dimensioned as a function of the angle of twist in such a manner that the twisted second shaping air is directed exactly onto the spray edge of the bell cup. For example, in one exemplary illustration, the radial offset between the axially orientated shaping air nozzles and the shaping air nozzles twisted in the circumferential direction can lie in the range of 0-1 millimeter (mm). In this manner it is achieved that both the axially orientated first shaping air and the twisted second shaping air are directed exactly onto the spray edge of the bell cup.

Furthermore, it may be desirable in the context of the exemplary illustrations that the shaping air jets discharged from the individual shaping air nozzles overlap in the circumferential direction or at least abut against one another without any gaps when impinging onto the spray edge of the bell cup on account of their jet expansion. The jet expansion of the individual shaping air jets may therefore be dimensioned in such a manner that the adjacent shaping air jets overlap at the spray edge of the bell cup in the circumferential direction or abut against one another without any gaps.

Here, it is to be noted that until the reaching of the spray edge of the bell cup, the axially orientated first shaping air covers a shorter distance than the twisted second shaping air, which is discharged from the shaping air nozzles twisted in the circumferential direction. The axially orientated shaping air nozzles therefore may have a larger nozzle opening and/or a larger jet expansion than the nozzle openings twisted in the circumferential direction, so that at the spray edge of the bell cup, in spite of the shorter path to the spray edge, the desired overlapping of the adjacent shaping air jets is ensured.

In another exemplary illustration, the shaping air ring has a circumferential annular depression on its end face. The bell cup here has a likewise annular circumferential bell cup rear edge on its rear side, which in the mounted state fits axially into the annular depression in the shaping air ring, so that the bell cup has a certain axial enclosure depth. An arrangement of this type is for example known from German Patent Publication No. DE 10 2006 057 596 and corresponding Canadian Patent Publication No. CA 2671224A1, each of which are hereby expressly incorporated by reference in their entireties, particularly with respect to the design structure of the annular depression and the bell cup rear edge.

The bell cup rear edge and the annular depression may be rounded with a certain or predetermined radius of curvature, the radius of curvature of the rounding of the bell cup rear edge being smaller than the radius of curvature of the rounding of the annular depression, which is advantageous for reasons of flow technology. For example, the radius of curvature of the rounding of the bell cup rear edge can be R=3.36 mm, whilst the radius of curvature of the rounding of the annular depression is R=4 mm. The exemplary illustrations are not however limited to the values mentioned previously by way of example with respect to the radii of curvature of the rounding of the bell cup rear edge or the annular depression. For example, the radius of curvature of the rounding of the bell cup rear edge can lie in one exemplary illustration in the range of 2 mm-5 mm, and in another exemplary illustration in the range of 3 mm-4 mm. The radius of curvature of the rounding of the annular depression can, in one example, lie in the range of 2 mm-5 mm and, in another example, in the range of 3.5 mm-4.5 mm.

Between the bell cup and the shaping air ring, there is here a gap with a certain gap width. Problematic here is the fact that the rotary bell cup generates a vacuum in this gap, as a result of which, coating agent and dirt can be sucked into the gap. The gap width of the gap between the shaping air ring and the bell cup therefore increases inwardly from the outside in the gap longitudinal direction. On the one hand, this is advantageous in the normal operation of the atomisation system, because as a result the disruptive vacuum generation in the gap is reduced, so that less coating agent is sucked into the gap. On the other hand, this gap geometry is advantageous during flushing, as the gap in this manner forms a nozzle which improves the flushing action.

The gap width of the gap between the bell cup and the shaping air ring may in some examples be larger than 0.5 mm, 0.7 mm or even larger than 0.8 mm, and smaller than 5 mm or even smaller than 4 mm. Here, the gap width of the gap between the bell cup and the shaping air ring may increase inwardly from the outside in the gap longitudinal direction by more than 1 mm or even by more than 2 mm, which may advantageously assist in achieving the previously mentioned advantage in terms of flow technology.

In one exemplary illustration, the atomisation system has a turbine for driving the bell cup which drives a bell cup shaft, on which the bell cup is mounted. Here, the shaping air ring may be fixed directly on the turbine or the turbine housing or the bearing unit, the shaping air ring particularly being screwed onto an external thread on the turbine housing. In this manner, it is ensured that the shaping air ring and the bell cup shaft run substantially or exactly coaxially. As a result, a radial misalignment between the bell cup shaft and the shaping air ring, which in the worst case scenario could lead to touch contact between the shaping air ring and the bell cup shaft, is prevented. The exemplary illustrations are not limited to a screw connection with respect to the mechanical connection between the shaping air ring and the turbine or the bearing unit, but rather can also be realised with other types of connection.

Furthermore, it is to be mentioned that the shaping air ring may encase the region of the bell cup shaft between the bell cup and the turbine completely, so that the bell cup in this region is not exposed and thus is less prone to contamination.

The external diameter of the bell cup at the spray edge may be essentially equal to 52.4 mm. The exemplary illustrations are not limited to this exact value with respect to the external diameter of the bell cup however, but rather can for example also be realised with external diameters which lie, in one exemplary illustration, in the range from 45 mm-60 mm, while in another exemplary illustration the external diameter lies in a range of 50 mm-55 mm.

Furthermore, the twisted shaping air nozzles may have a nozzle diameter of essentially 0.65 mm or 0.6 mm, whilst the nozzle diameter of the diameter of the axially orientated shaping air nozzles may be essentially 0.7 mm. The nozzle diameter of the twisted shaping air nozzles can however also lie in the range of 0.5-0.9 mm, whilst the nozzle diameter of the axially orientated shaping air nozzles can lie in the range of 0.5 mm-0.9 mm. The exemplary illustrations are not however limited to the previously mentioned value ranges with respect to the nozzle diameter, but rather can also be realised with other values as a function of the particular geometry of the bell cup.

Further, it is to be mentioned that, in the conventional manner, the bell cup has an outer peripheral surface which is angled with a certain peripheral surface angle with respect to the axis of rotation of the bell cup, the peripheral surface angle being, in one exemplary illustration, 25°. The peripheral surface angle can however also lie, in one exemplary illustrations, in the range of 5°-45°, and in another exemplary illustration in a range of 20°-35°.

Furthermore, the peripheral surface of the bell cup can be structured for example by means of a concave or convex shaping or by means of circumferential grooves. A structuring of this type of the bell cup peripheral surface is for example described in the above-referenced DE 10 2006 057 596, corresponding Canadian Patent Publication No. CA 2671224A1, and EP 1 250 960 A2, each of which being hereby expressly incorporated by reference in their entireties.

Furthermore, the bell cup may have an axial peripheral surface length of 12.75 mm. The exemplary illustrations are not limited to this exact value with respect to the axial peripheral surface however, but rather can for example also be realised with axial peripheral surface lengths which lie in the range, in one exemplary illustration, from 5 mm-25 mm, and in another exemplary illustration in a range of 10 mm-15 mm.

Further, there may be a certain spacing in the axial direction between the shaping air nozzles and the spray edge of the bell cup. On the one hand, an axial spacing between the shaping air nozzles and the spray edge of the bell cup which is too large leads to the shaping air when impinging onto the spray edge of the bell cup already having lost too much flow energy and therefore no longer being able to contribute to the atomisation action to a satisfactory degree. On the other hand, an axial spacing between the shaping air nozzles and the spray edge of the bell cup which is too small leads to no homogeneous air jet cone being able to form, as the jet expansion is not large enough on account of the shortness of the path available, so that the shaping air jet simply penetrates the spray jet without leading to the desired atomisation action (jet deflection). The axial spacing between the shaping air nozzles and the spray edge of the bell cup may therefore be 6.3 mm. The exemplary illustrations are not limited to the previously mentioned exact value with respect to the axial spacing between the shaping air nozzles and the spray edge of the bell cup however, but rather can for example also be realised with an axial spacing, in one exemplary illustration, in the range from 1 mm-15 mm, in another exemplary illustration, in a range of 2 mm-10 mm, and in yet another exemplary illustration, in a range of 3 mm-5 mm.

Further, the exemplary bell cup may have an overflow surface in any manner that is convenient, which is inclined with a certain angle with respect to the axis of rotation of the bell cup. This angle may be essentially 74°. The exemplary illustrations are not limited to the previously mentioned exact value with respect to the angle of inclination of the overflow surface however, but rather can also be realised with angles, in one exemplary illustration, in a range of 50°-90°, and in another exemplary illustration an angular range of 70°-80°.

Furthermore, the bell cup according to the exemplary illustrations can optionally have a straight or a curved spray edge.

Furthermore, the exemplary illustrations also comprise a corresponding method of operation which stands out on account of the fact that the atomisation system or the rotary atomiser with this atomisation system is used both for interior painting and for exterior painting.

The atomisation system may furthermore also be used for the application of metallic paint or other effect paints.

Furthermore, the exemplary atomisation systems may also be used for the application of filler and/or clear coat.

The speed of the bell cup is here may be adjusted as a function of the respective type of painting and paint (filler, base coat, clear coat), in order to achieve a good painting result. So, for interior painting of motor vehicle body components, a speed in the range of 5,000 $min^{-1}$-40,000 $min^{-1}$ may be set, whilst in the case of exterior painting, a speed in the range of 30,000 $min^{-1}$-70,000 $min^{-1}$ may be employed. In the case of the application of metallic paint or another effect paint a speed in the range of 10,000 $min^{-1}$-70,000 $min^{-1}$ may be set, by contrast.

The applied colour quantity can here lie, in one exemplary illustration, in the range of 50 ml/min to 1,000 ml/min and, in another exemplary illustration, in particular in the range of 100 ml/min-200 ml/min.

Further, a shaping air flow, which may lie in the range of 0 Nl/min to 700 Nl/min, may be discharged from the twisted shaping air nozzles. By contrast, a shaping air flow, which lies in the range of 100 Nl/min to 800 Nl/min, may by contrast be discharged from the axially orientated shaping air nozzles.

Other advantageous developments of the exemplary illustrations are characterised explained in more detail below.

Turning now to FIG. 1, an exemplary atomisation system, which can be used in an otherwise conventionally constructed rotary atomiser and is suitable both for interior painting and for exterior painting of motor vehicle body components, is illustrated. The motor vehicle body parts can for example be motor vehicle bodies or attachment parts (e.g. bumpers, mirror housings).

Furthermore, the exemplary atomisation system shown is also suitable for the application of metallic paints or other effect paints, as well as filler and clear coat.

To this end, the atomisation system has a compressed air turbine 1 which is substantially conventionally constructed and drives a bell cup shaft 2. Instead of the compressed air turbine 1, another drive unit can also be used for example, such as an electric motor for example.

A novel bell cup 3, which is also described in detail, is screwed onto the bell cup shaft 2 at the front.

Furthermore, the compressed air turbine 1 has an external thread in the front region on its peripheral surface, onto which external thread a shaping air ring 4 is screwed, the shaping air ring being shown in detail in the FIGS. 8 to 12. The advantage of the direct screwing of the shaping air ring 4 onto the compressed air turbine 1 is the fact that the shaping air ring 4 and the bell cup shaft 2 are orientated exactly coaxially. As a result, a radial misalignment between the shaping air ring 4 and the bell cup shaft 2 is substantially prevented, as a result of which in the worst case scenario a touch contact could occur between the shaping air ring 4 and the bell cup shaft 2.

The bell cup 3 here has an annular circumferential spray edge 5 with a diameter $d_A$=52.4 mm. In combination with the other design features, this diameter of the bell cup 3 allows a satisfactory atomisation of the applied coating agent, even in the case of high discharge quantities, as are required for example in the case of exterior painting of motor vehicle body components. In the case of an application of metallic paints, a better atomisation is then required however, for which end the shaping air blown out by the shaping air ring 4 is used, as is described in the following.

Thus, the shaping air ring 4 has two shaping air nozzle annuluses, by means of which shaping airs, which can be controlled separately from one another, can be discharged onto the spray jet.

On the one hand, the shaping airs allow a shaping of the spray jet discharged by the bell cup 3.

On the other hand, the shaping airs contribute to the atomisation of the applied coating agent.

The first shaping air nozzle annulus has a plurality of axially orientated shaping air nozzles 6, which are arranged over the circumference of the shaping air ring 4, distributed in an equidistant manner, and discharge a first shaping air axially onto the spray edge 5 of the bell cup 3, which contributes to the atomisation.

The second shaping air nozzle annulus has a plurality of shaping air nozzles 7 twisted in the circumferential direction, which shaping air nozzles discharge a second shaping air onto the spray edge 5 of the bell cup 3, the second shaping air being angled against the direction of rotation of the bell cup 3 and as a result contributing to the atomisation of the coating agent discharged by the bell cup 3. The angle of twist of the shaping air nozzles 7 is 55° here. This means that the second shaping air leaves the shaping air nozzles 7 with an angle of 55° with respect to the longitudinal axis in the circumferential direction.

The two shaping air nozzle annuluses in each case have a diameter of essentially 52 mm, which corresponds to the external diameter of the spray edge 5 of the bell cup 3. This is advantageous because the shaping airs therefore impinge relatively precisely onto the spray edge 5 of the bell cup 3 and thus develop a good atomisation action.

In spite of the angle of twist, the second shaping air exiting the shaping air nozzles 7 should impinge onto the spray edge 5 of the bell cup 3 as exactly as possible, that is to say without a radial overlapping or a radial spacing in relation to the spray edge 5. The second shaping air nozzle annulus with the twisted shaping air nozzles 7 is therefore slightly inwardly offset in the radial direction with respect to the first shaping air nozzle annulus with the axially orientated shaping air nozzles 6, the radial offset being dimensioned in accordance with the angle of twist of the shaping air nozzles 7 in such a manner that the shaping air exiting from the twisted shaping air nozzles 7 impinges onto the spray edge 5 of the bell cup 3 exactly.

The axially orientated shaping air nozzles here have a nozzle diameter of 0.7 mm, whilst an axial spacing a=6.3 mm lies between the spray edge 5 of the bell cup 3 and the shaping air nozzles 6. This has the consequence that the shaping air jets exiting from the axially orientated shaping air nozzles 6 overlap slightly in the circumferential direction at the spray edge 5 of the bell cup 3.

The twisted shaping air nozzles 7 by contrast have a nozzle diameter of 0.65 mm, which is slightly smaller than the nozzle diameter of the axially orientated shaping air nozzles 6. This makes sense, as the shaping air jets exiting from the twisted shaping air nozzles 7 cover a longer distance until impinging onto the spray edge 5 of the bell cup 3 and therefore expand to a greater extent. The reduction of the nozzle diameter of the twisted shaping air nozzles 7 compared to the axially orientated shaping air nozzles 6 ensures however that the shaping air jets exiting from the twisted shaping air nozzles 7 overlap slightly in the circumferential direction at the spray edge 5 of the bell cup 3, as also applies for the shaping air jets which exit from the axially orientated shaping air nozzles 6.

The previously mentioned dimensions may enable a good atomisation action of the two shaping airs. Thus, a smaller axial spacing a between the shaping air nozzles 6, 7 and the spray edge 5 of the bell cup 3 would lead to the shaping airs having too much flow energy, so that the shaping air jets would simply penetrate the spray jet without essentially contributing to the atomisation action. A greater spacing a between the shaping air nozzles 6, 7 and the spray edge 5 of the bell cup 3 would by contrast have the consequence that the flow energy of the shaping airs as far as the impinging onto the spray edge 5 would already be strongly reduced and therefore no satisfactory atomisation can develop any more.

The two shaping air nozzle annuluses with the axially orientated shaping air nozzles 6 and the twisted shaping air nozzles 7 in each case may have separate shaping air inlets 8, 9 which can be controlled separately from one another by means of the atomiser flange.

Furthermore, the shaping air ring 4 may have a coaxially circumferential annular depression 10 on its end face, into which, in the mounted state, a likewise annularly circumferential bell cup rear edge 11 axially fits. The shaping air ring 4 therefore encases the axial region between the end face of the compressed air turbine 1 on the one hand and the bell cup 3, so that the bell cup shaft 2 is not exposed in this region, as a result of which contaminations of the bell cup shaft 2 are prevented.

Between the bell cup rear edge 11 and the annular depression 10 in the shaping air ring 4, runs a gap 12 here, which is optimised in terms of flow technology, as is described in the following.

On the one hand, the bell cup rear edge 11 has a rounding with a radius of curvature Ri=3.36 mm, whilst the annular depression 10 has a rounding with a radius of curvature Ra=4 mm. This means that the radius of curvature Ri of the bell cup rear edge 11 is smaller than the radius of curvature Ra of the annular depression 10, which is particularly beneficial in terms of flow technology and counteracts the disruptive vacuum formation in the gap 12.

On the other hand, the gap 12 between the bell cup rear edge 11 and the annular depression 10 has a gap width which increases inwardly from the outside in the gap longitudinal direction. Thus, the gap width at the inlet of the gap 12 b1=0.844 mm. At the vertex of the bell cup rear edge 11, the gap width is then b2=0.915 mm. Radially inside the bell cup rear edge 11, the gap width is then finally b3=3.19 mm. The gap 12 therefore narrows outwardly from the inside. In normal coating operation, the disruptive vacuum formation in the gap 12 is counteracted as a result. During the flushing of the bell cup 3, the narrowing gap 12 by contrast acts as a nozzle and therefore supports the flushing action at the peripheral surface 13 of the bell cup 3.

The bell cup 3 here has a peripheral surface 13 which is angled with respect to the bell cup shaft 2 by $\alpha$=25°.

Figure 7:
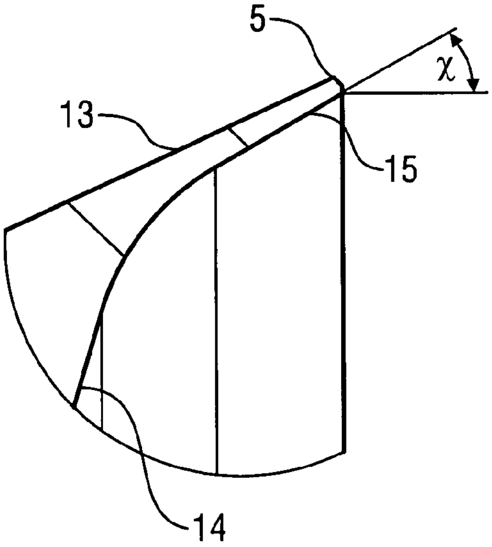
FIG. 7 shows a detail view of the cross-sectional illustration of the bell cup in FIG. 3 in the region of the spray edge.
Figure 8:
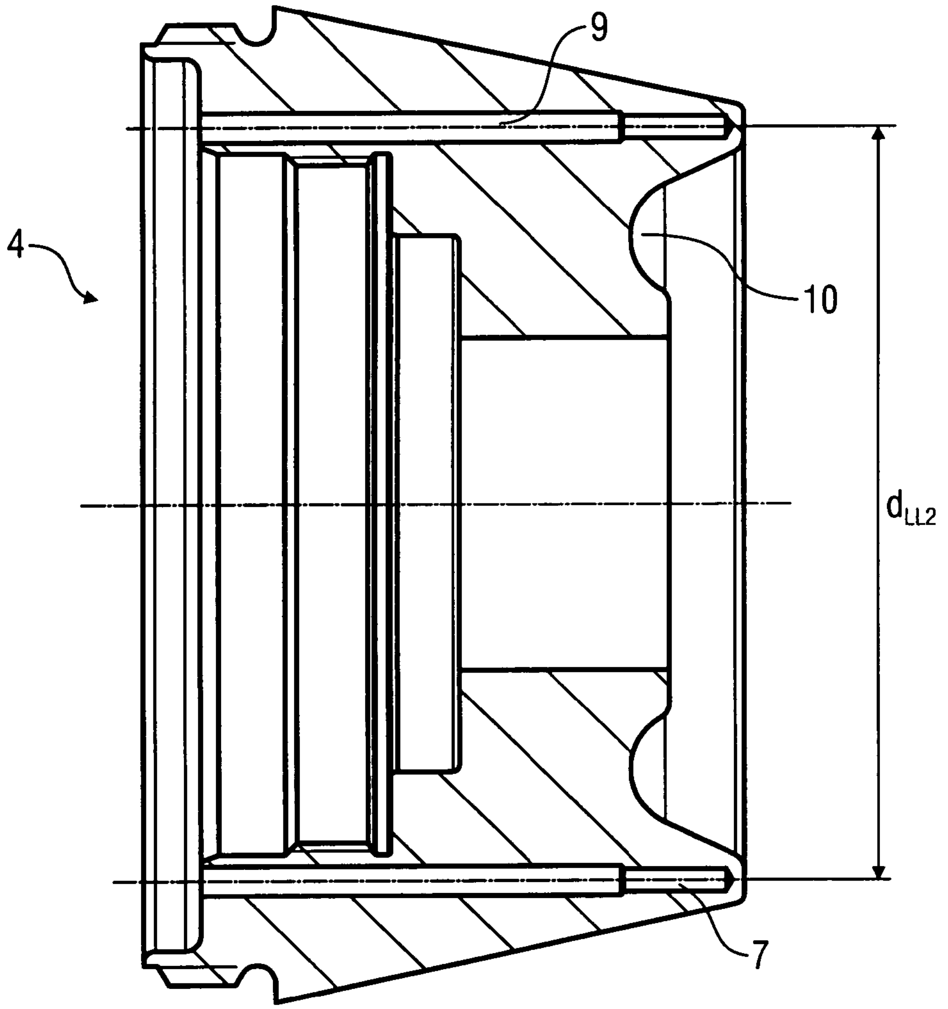
FIG. 8 shows a cross-sectional view of the shaping air ring along the section B-B in FIG. 10.
Figure 9:
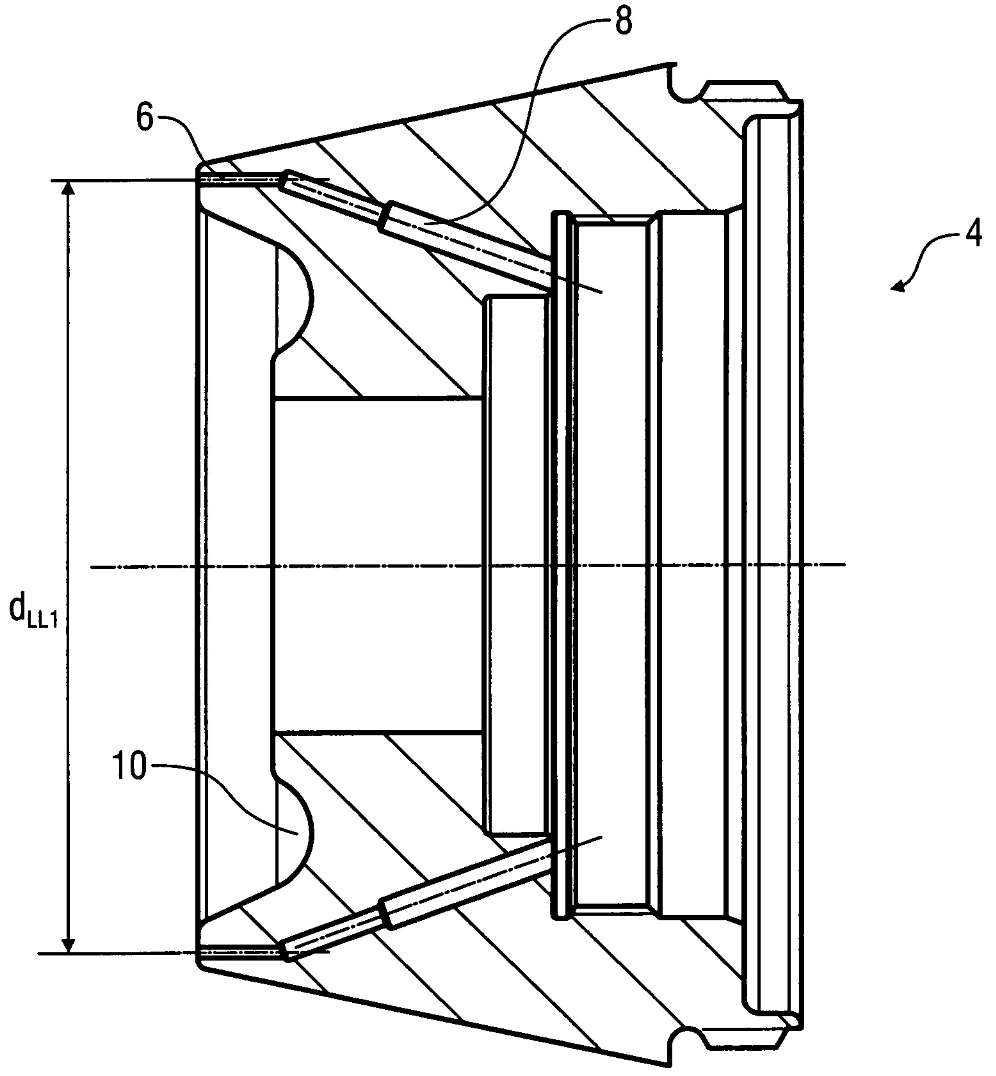
FIG. 9 shows a cross-sectional view of the shaping air ring along the section line A-A in FIG. 10.
Figure 10:
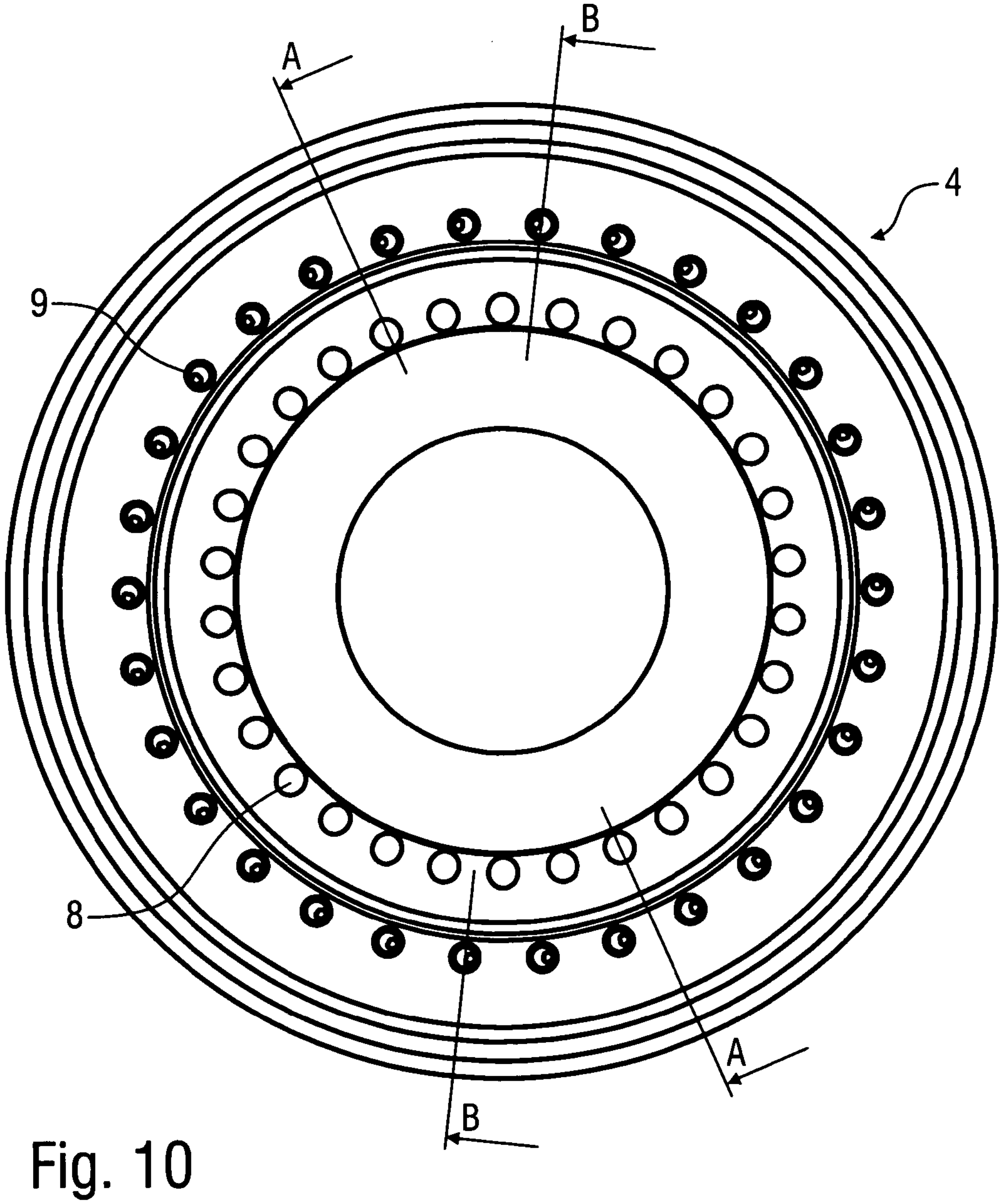
FIG. 10 shows a rear view of the shaping air ring from FIG. 1.
Figure 11:
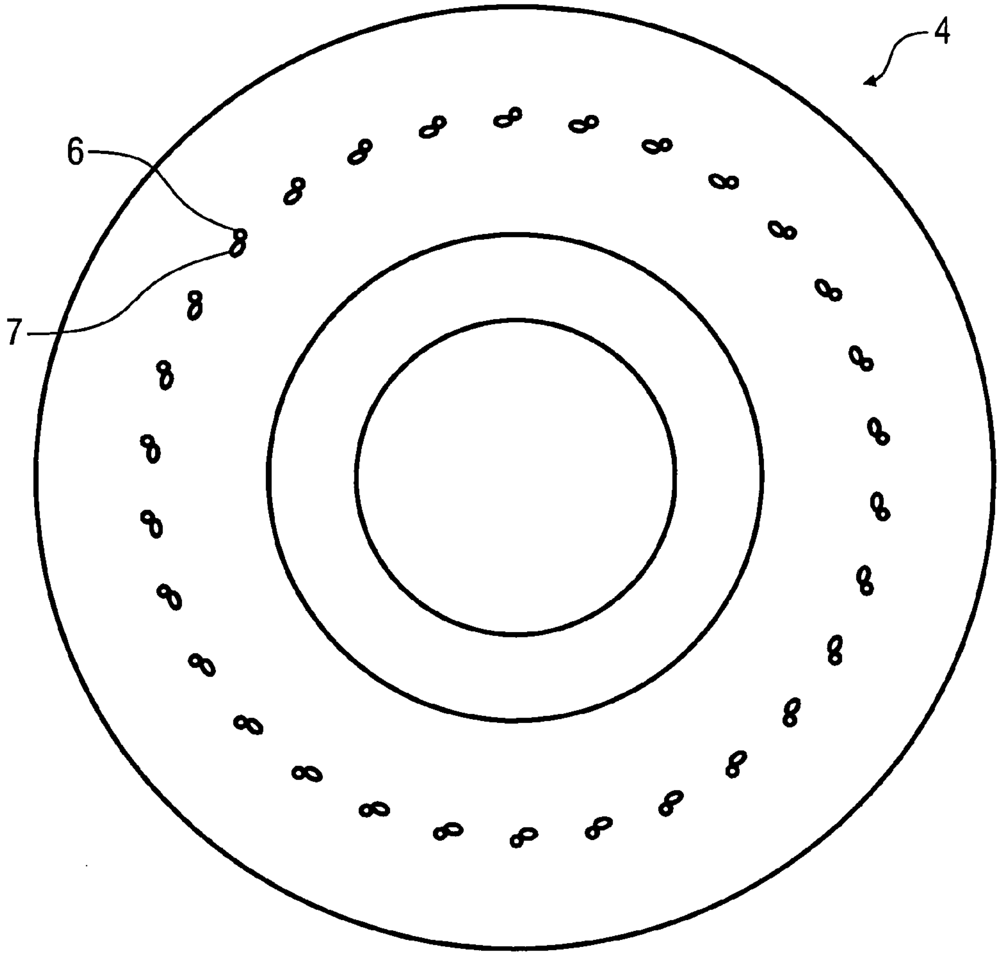
FIG. 11 shows a front view of the shaping air ring from FIG. 1, and also
Figure 12:
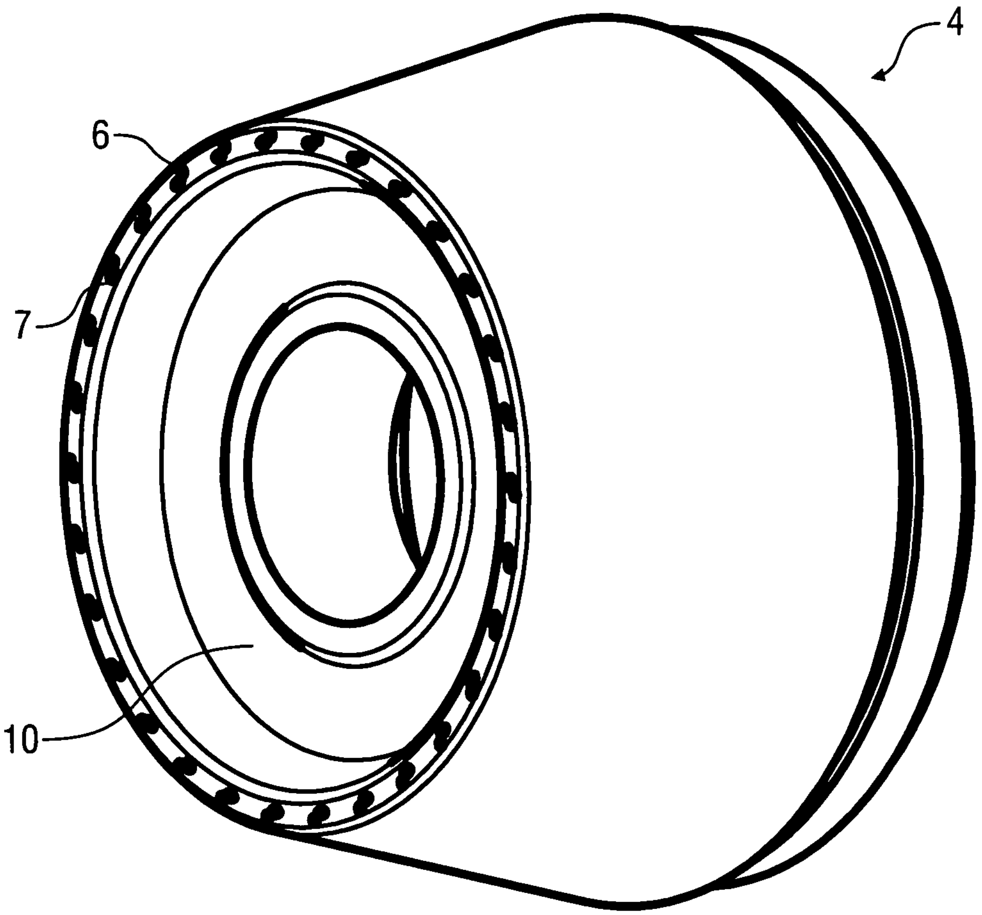
FIG. 12 shows a perspective view of the shaping air ring from FIG. 1.

Furthermore, the bell cup 3 has an overflow surface 14 which is angled with respect to the bell cup shaft 2 by $\beta$=74°. In the region of the spray edge 5, a more strongly angled region 15 is provided by contrast, which is angled with respect to the bell cup shaft 2 by $\chi$=30° (cf. FIG. 7). The previously mentioned curved spray edge 5 with the enlarged angle $\chi$ is not absolutely necessary however.

Further, in the conventional manner, the bell cup 3 has outer flushing channels 16.

The exemplary illustrations are not limited to the specific examples illustrated above. Rather, a plurality of variations and alterations are possible that also make use of the ideas described herein, and therefore fall within the scope of protection. Reference in the specification to "one example," "an example," "one embodiment," or "an embodiment" means that a particular feature, structure, or characteristic described in connection with the example is included in at least one example. The phrase "in one example" in various places in the specification does not necessarily refer to the same example each time it appears.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be evident upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "the," etc. should be read to recite one or more of the indicated elements unless a claim recites an explicit limitation to the contrary.

LIST OF REFERENCE NUMERALS

1 Compressed air turbine
2 Bell cup shaft
3 Bell cup
4 Shaping air ring
5 Spray edge
6 Axially orientated shaping air nozzles
7 Twisted shaping air nozzles
8 Shaping air inlet
9 Shaping air inlet

10 Annular depression
11 Bell cup rear edge
12 Gap
13 Peripheral surface
14 Overflow surface
15 More strongly angled region
16 Outer flushing channels
b1 Gap width
b2 Gap width
b3 Gap width
Ri Radius of curvature of the bell cup rear edge
Ra Radius of curvature of the annular depression

The invention claimed is:

1. Atomisation system for a rotary atomiser for the application of a coating agent, comprising:

a rotatably mounted bell cup having an annular circumferential spray edge with a predetermined external diameter, the bell cup being configured to atomize the coating agent and discharge a spray jet of the coating agent, a shaping air ring having a first shaping air nozzle annulus with a first plurality of shaping air nozzles arranged in an annularly distributed manner and a second shaping air nozzle annulus with a plurality of shaping air nozzles arranged in an annularly distributed manner, the shaping air ring being configured to discharge a first shaping air and a second shaping air for shaping the spray jet discharged by the bell cup such that the first shaping air and the second shaping air are each directed onto the spray edge of the bell cup, wherein the two shaping airs have separate shaping air inlets and are adjustable independently of one another, wherein the shaping air nozzles of the first shaping air nozzle annulus are oriented axially and axially discharge the first shaping air, the shaping air nozzles of the second shaping air nozzle annulus are twisted shaping air nozzles oriented in the circumferential direction against the direction of rotation of the bell cup and discharge the second shaping air with a predetermined angle of twist in the circumferential direction, and the twisted shaping air nozzles have a smaller nozzle diameter than the axially oriented shaping air nozzles.

2. Atomisation system according to claim 1, wherein the bell cup and the shaping air ring are configured to apply a metallic paint.

3. Atomisation system according to claim 1, wherein a) the twisted shaping air nozzles of the second shaping air nozzle annulus are arranged with a predetermined radial inward offset with respect to the axially orientated shaping air nozzles of the first shaping air nozzle annulus, b) the radial offset between the twisted shaping air nozzles and the axially orientated shaping air nozzles is dimensioned as a function of the angle of twist in such a manner that the twisted second shaping air is directed onto the spray edge of the bell cup.

4. Atomisation system according to claim 1, wherein the twisted shaping air nozzles have a smaller jet expansion than the axially orientated shaping air nozzles.

5. Atomisation system according to claim 1, wherein a) the axially orientated first shaping air has a jet expansion which is dimensioned in such a manner that the shaping air jets from the directly adjacent shaping air nozzles adjoin one another without any gaps in the circumferential direction or overlap in the circumferential direction at the spray edge of the bell cup, and b) the first shaping air twisted in the circumferential direction has a jet expansion which is dimensioned in such a manner that the shaping air jets from the directly adjacent shaping air nozzles adjoin one another without any gaps in the circumferential direction or overlap in the circumferential direction at the spray edge of the bell cup.

6. Atomisation system according to claim 1, wherein a) the shaping air ring has an annular depression in its end face, and b) the bell cup has an annular circumferential bell cup rear edge on its rear side, which fits axially into the annular depression in the shaping air ring, so that the bell cup has a certain axial enclosure depth.

7. Atomisation system according to claim 6, wherein a) the bell cup rear edge is rounded with a certain radius of curvature, and b) the annular depression in the shaping air ring is rounded with a certain radius of curvature, and c) the radius of curvature of the rounding of the bell cup rear edge is smaller than the radius of curvature of the rounding of the annular depression.

8. Atomisation system according to claim 1, wherein between the bell cup and the shaping air ring, there is here a gap with a certain gap width, wherein the gap width increases inwardly from the outside in the gap longitudinal direction.

9. Atomisation system according to claim 1, wherein a) a turbine is provided for driving the bell cup, which drives a bell cup shaft, on which the bell cup is mounted, and b) the shaping air ring is fixed directly on the turbine.

10. Atomisation system according to claim 9, wherein the shaping air ring encases the region of the bell cup shaft between the bell cup and the turbine completely.

11. Atomisation system according to claim 1, wherein a) the external diameter of the bell cup and the diameter of the two shaping air nozzle annuluses is larger than 45 mm, and b) the external diameter of the bell cup and the diameter of the two shaping air nozzle annuluses is smaller than 60 mm, and c) the twisted shaping air nozzles have a nozzle diameter of more than 0.5 mm, and d) the twisted shaping air nozzles have a nozzle diameter of less than 0.9 mm, and e) the axially orientated shaping air nozzles have a nozzle diameter of more than 0.5 mm, and f) the axially orientated shaping air nozzles have a nozzle diameter of less than 0.9 mm, and g) the diameter of the first and of the second shaping air nozzle annulus has a radial deviation of less than ±3 mm compared to the external diameter of the bell cup, and h) the angle of twist of the twisted shaping air nozzles is larger than 40°, and i) the angle of twist of the twisted shaping air nozzles is smaller than 70°, and j) the bell cup has a peripheral surface with a peripheral surface angle of more than 5° with respect to the axis of rotation of the bell cup, and k) the bell cup has a peripheral surface with a peripheral surface angle of less than 40° with respect to the axis of rotation of the bell cup, and l) the bell cup has an axial peripheral surface length of less than 25 mm, and m) the bell cup has an axial peripheral surface length of more than 5 mm, and n) the bell cup and the shaping air ring have an enclosure depth in the axial direction of less than 10 mm, and o) the bell cup and the shaping air ring have an enclosure depth in the axial direction of more than 2 mm, and p) an axial spacing of more than 1 mm between the shaping air nozzles and the spray edge of the bell cup, and q) an axial spacing of less than 15 mm between the shaping air nozzles and the spray edge of the bell cup, and r) the radius of curvature of the rounding of the bell cup rear edge is larger than 2 mm, and s) the radius of curvature of the rounding of the bell cup rear edge is smaller than 5 mm, and t) the radius of curvature of the rounding of the annular depression in the shaping air ring is larger than 2 mm, and u) the radius of curvature of the rounding of the annular depression in the shaping air ring is smaller than 5 mm, and v) in that the gap width between the bell cup and the shaping air ring is larger than 0.5 mm, and w) the gap width between the bell cup and the shaping air ring is smaller than 5 mm, and x) the gap width between the bell cup and the shaping air ring increases inwardly from the outside by more than 1 mm, and y) the bell cup has an overflow surface which is inclined with an angle of more than 50° with respect to the axis of rotation of the bell cup, and z) the bell cup has an overflow surface which is inclined with an angle of less than 90° with respect to the axis of rotation of the bell cup.

12. Atomisation system according to claim 1, further comprising a) an application efficiency according to German industrial standard DIN EN 13966-1 (Determination of the Transfer Efficiency of Atomising and Spraying Equipment for Liquid Coating Materials Part 1: Flat Panels) which is greater than 55% in the case of interior painting and in the case of exterior painting and in the case of metallic painting, and b) a total colour difference ΔE* of less than ±1 in the case of interior painting and in the case of exterior painting and in the case of metallic painting.

13. Atomisation system according to claim 1, wherein each of the first annulus and the second annulus have respective diameters that are designed to be equal to one another and to the predetermined external diameter.

14. Atomisation system according to claim 1, wherein the bell cup and the shaping air ring are designed in such a manner that the atomisation system is suitable for an interior painting of motor vehicle body components and for an exterior painting of motor vehicle body components.

* * * * *